United States Patent
Loo et al.

(10) Patent No.: US 7,919,361 B2
(45) Date of Patent: Apr. 5, 2011

(54) SEMICONDUCTOR PACKAGE WITH POSITION MEMBER

(75) Inventors: Kum-weng Loo, Singapore (SG); Chek-lim Kho, Singapore (SG); Jing-en Luan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 12/800,639

(22) Filed: May 19, 2010

(65) Prior Publication Data

US 2010/0297813 A1 Nov. 25, 2010

Related U.S. Application Data

(62) Division of application No. 11/545,814, filed on Oct. 10, 2006, now Pat. No. 7,745,945.

(30) Foreign Application Priority Data

Oct. 14, 2005 (SG) ................................ 200506718-6

(51) Int. Cl.
*H01L 21/56* (2006.01)
*H01L 21/60* (2006.01)

(52) U.S. Cl. . 438/123; 438/124; 438/127; 257/E21.504; 257/E21.506

(58) Field of Classification Search .................. 257/787, 257/796, 706, 666, E23.003, E23.116, E23.037, 257/E23.135, E21.504, E21.506; 438/123, 438/134, 127

See application file for complete search history.

(56) References Cited

U.S. PATENT DOCUMENTS

| 5,293,301 A * | 3/1994 | Tanaka et al. .................. 361/707 |
| 5,559,306 A * | 9/1996 | Mahulikar ...................... 174/538 |
| 5,892,278 A * | 4/1999 | Horita et al. ................... 257/706 |
| 6,114,752 A | 9/2000 | Huang et al. |
| 6,696,750 B1 * | 2/2004 | Yin et al. ........................ 257/675 |
| 7,074,653 B2 * | 7/2006 | Lange ............................ 438/122 |
| 2003/0001252 A1 * | 1/2003 | Ku et al. ......................... 257/686 |
| 2004/0046241 A1 * | 3/2004 | Combs et al. .................. 257/678 |

FOREIGN PATENT DOCUMENTS

JP 06295970 10/1994
JP 2002050646 2/2002

OTHER PUBLICATIONS

Australian Patent Office Search Report dated Feb. 6, 2009 in connection with Australian Patent Application No. SG 200506718-06.
Australian Patent Office Written Opinion dated Feb. 6, 2009 in connection with Australian Patent Application No. SG 200506718-06.

* cited by examiner

*Primary Examiner* — Victor Mandala
(74) *Attorney, Agent, or Firm* — Lisa K. Jorgenson; William A. Munck

(57) ABSTRACT

The present disclosure provides a very thin semiconductor package including a leadframe with a die-attach pad and a plurality of lead terminals, a die attached to the die-attach pad and electrically connected to the lead terminals via bonding wires, a position member disposed upon the die and/or die-attach pad, and a molding material encapsulating the leadframe, the die, and the position member together to form the semiconductor package. The method for manufacturing a very thin semiconductor package includes disposing a first position member on one side of the die-attach pad of a leadframe, attaching a die onto the opposite side of the die-attach pad, optionally disposing a second position member on top of the die, electrically connecting the die to the lead terminals of the leadframe, and encapsulating the leadframe, the die, and the position member(s) together to form the very thin semiconductor package.

22 Claims, 3 Drawing Sheets

SEMICONDUCTOR PACKAGE WITH POSITION MEMBER

CROSS-REFERENCE TO RELATED APPLICATIONS

This patent application is a divisional of U.S. patent application Ser. No. 11/545,814 filed Oct. 10, 2006, now U.S. Pat. No. 7,745,945, which claims priority under 35 U.S.C. §119(a) to Singapore Patent No. 200506718-6 entitled "SEMICONDUCTOR PACKAGE WITH POSITION MEMBER AND METHOD OF MANUFACTURING THE SAME" filed on Oct. 14, 2005, which is hereby incorporated by reference.

TECHNICAL FIELD

The present disclosure generally relates to semiconductor packages and packaging technologies, and more particularly to a semiconductor package including at least one position member. In addition, the present disclosure also includes a method for manufacturing a semiconductor package with at least one position member.

BACKGROUND

In semiconductor package designs, semiconductor dies are mounted onto a substrate, and then encapsulated in a mold cavity. As semiconductor packages get thinner and thinner, molding cavity and molding gaps are so stretched that only a very thin layer of molding compound covers the die(s). Therefore, any variation of compound thickness will result in package warping. In addition, mismatch of coefficient of thermal expansion (CTE) between various materials inside a thin package can cause huge warpage.

Thin semiconductor packages employ thin dies and leadframes. As a result, when the die and leadframe thickness gets thinner, they are more prone to flexing during the assembly process. FIG. 1 is an exemplary thin semiconductor package 1 that includes a split pad 2, a lead terminal 3, a die 4, a bond wire 5, and an encapsulant 6. Since the gap between the pad 2 and the upper molding surface (not shown) is very narrow, the mold flow will cause the die 4 to flex (from 4 to 4') and the die pad 2 to shift.

Currently, attempts have been made to remedy the warpage problems for semiconductor packages. For example, U.S. Pat. No. 6,331,448 discloses a semiconductor package that includes a leadframe with offsets from a major plane at a non-perpendicular angle thereto. The offsets are an attempt to prevent warpage, bowing, skewing, or other distortions of the semiconductor package 1 when subjected to the high temperature or changes in temperature. As another example, U.S. Pat. No. 6,020,221 discloses a semiconductor device that comprises a stiffener member, where the stiffener member is attachable to the semiconductor package substrate for purposes of minimizing package warpage. Currently, however, issues concerning flexing problems of the die 4 and/or the die-attach pad during the molding process are not adequately addressed.

There have also been attempts to remedy the displacement of assembly components during the molding process of a semiconductor package. For example, U.S. Pat. No. 6,028,368 discloses a semiconductor device with potting resin structures that are affixed to a plurality of predetermined faces of the leadframe so as to limit the shifting of the die and leadframe structures during the molding process. However, these potting structures may not able to stop the vertical movement of the die and leadframe completely.

Another example of problems in semiconductor packages concerns the encapsulation of dies mounted on a flexible tape substrate. When positioned in a mold tooling, as a molding compound flows into the mold chamber and around the mounted die, the flexible tape can flutter and become warped or bent resulting in a bowed die structure, and an uneven layer of encapsulant formed around the die structure, which can lead to structure failure. U.S. Patent Application Publication No. 2005/0023562 A1 discloses a semiconductor device that comprises a pair of semiconductor dies mounted on opposing side of a flexible tape substrate, the outer surfaces of the dies having one or more standoffs disposed thereon. The standoffs can be brought into contact with an inner surface of the mold plates of a mold tooling when the device is positioned between the mold plates to maintain the flexible tape substrate in a centralized position within a mold chamber and inhibit the tape from bending as a molding compound flows into the chamber during encapsulation. This may be perfectly suitable for flexible substrate when the semiconductor device is bulky. As for thin semiconductor packages, however, both the warpage and die/pad flexing have to be taken into consideration.

SUMMARY

This disclosure provides a very thin semiconductor package exhibiting a good balance of warpage control and die/pad flexing.

In one embodiment, the present disclosure provides a very thin semiconductor package. The package includes a leadframe with a plurality of lead terminals and a die-attach pad. A die is disposed onto the die-attach pad and a plurality of bonding wires electrically connect the die and the plurality of lead terminals. The package includes at least one position member disposed directly under the die or directly above the die-attach pad, wherein the position member prevents large variation occurrence during package assembly process. The package also includes a molding compound for encapsulating the leadframe, the die, the bonding wires, and the position member so as to form the very thin semiconductor package.

In another embodiment, the present disclosure provides a method for manufacturing a very thin semiconductor package. The method includes providing a leadframe with a plurality of lead terminals and a die-attach pad and disposing a first position member to one side of the die-attach pad. The method further includes disposing a die to another side of the die-attach pad opposite to the first position member. The die is electrically connected to the plurality of lead terminals. The method further includes encapsulating the leadframe, the die, bonding wires, and the first position member so as to form the very thin semiconductor package.

In still another embodiment, the present disclosure provides a method for manufacturing a very thin semiconductor package which includes providing a leadframe with a plurality of lead terminals and a die-attach pad. The method includes disposing a die to one side of the die-attach pad and disposing a first position member to the other side of the die. The method further includes electrically connecting die to the plurality of lead terminals and encapsulating the leadframe, the die, bonding wires, and the first position member so as to form the very thin semiconductor package.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Throughout this application, where publications are referenced, the publications are hereby incorporated by reference, in their entireties, into this application in order to more fully describe the state of art to which this invention pertains.

The present disclosure provides a very thin semiconductor package that has a good balance of warpage and die/pad flexing, and a method for manufacturing the very thin semiconductor package. Prior to detailed description of the package and method, it is to be appreciated that the basic manufacturing technology and semiconductor designs are well known to those skilled in the art. Therefore, if the missing of any details will not affect the practice of the principles of the present disclosure, the details will not be provided herein for the sake of brevity and simplicity.

Briefly, the very thin semiconductor package in accordance with one embodiment of the present disclosure includes a leadframe with a die-attach pad and a plurality of lead terminals, a die attached to the die-attach pad and electrically connected to the lead terminals via bonding wires, a position member disposed upon the die and/or die-attach pad, and a molding material encapsulating the leadframe, the die, and the position member together to form the semiconductor package. The position member is used for controlling the die Z-position within the very thin semiconductor package so as to prevent large variation from occurring during the package assembly process. The "Z-position" used herein refers to the vertical variation.

Figure 1:
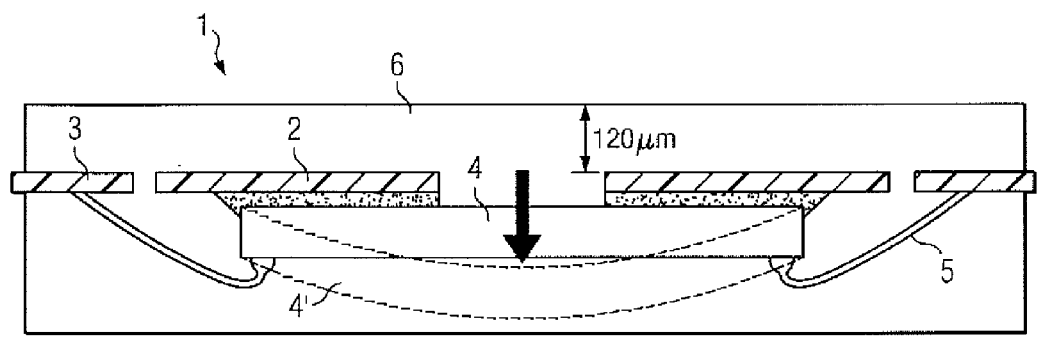
FIG. 1 illustrates the die/pad flexing problem encountered in the molding process of a very thin semiconductor package.
Figure 2A:
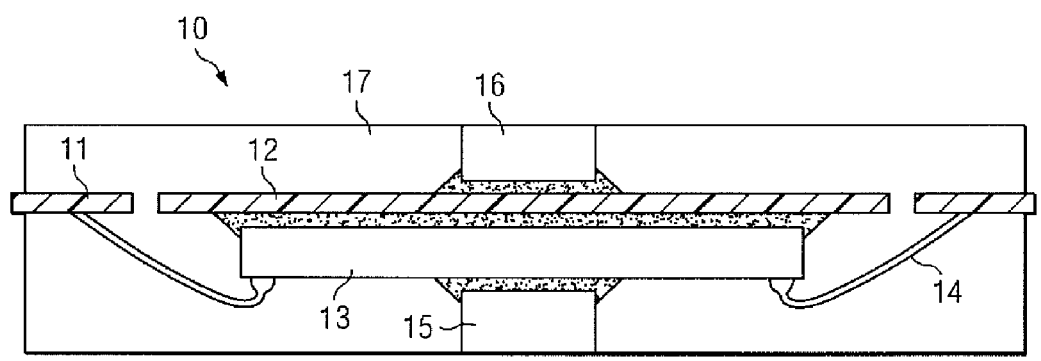
FIG. 2A is a cross-section view of one die-down very thin semiconductor package in accordance with one embodiment of the present disclosure.

Now referring to FIG. 2A, the very thin semiconductor package 10 comprises a leadframe with lead terminals 11 and die-attach pad 12, a die 13 disposed onto the die-attach pad 12, bonding wires 14 electrically connecting the die 13 and the lead terminals 11, two position members 15, 16 disposed directly under the die 13 or directly above the die-attach pad 12 for preventing large variation occurrence during package assembly process, and a molding compound 17 for encapsulating the semiconductor package. In certain embodiments, the position member could be an integral part of the leadframe.

Figure 2B:
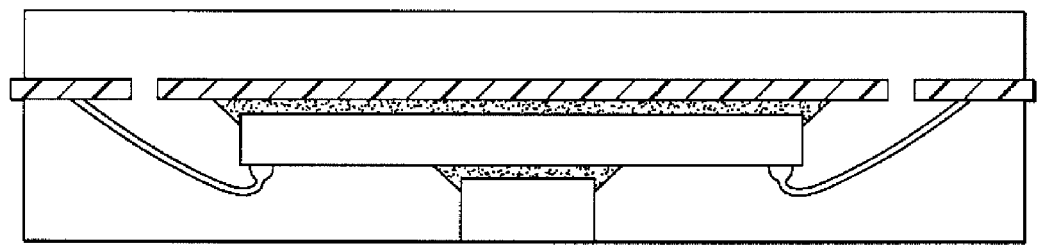
FIG. 2B is a cross-section view of another die-down very thin semiconductor package with an offset die-attach pad in accordance with one embodiment of the present disclosure.
Figure 2C:
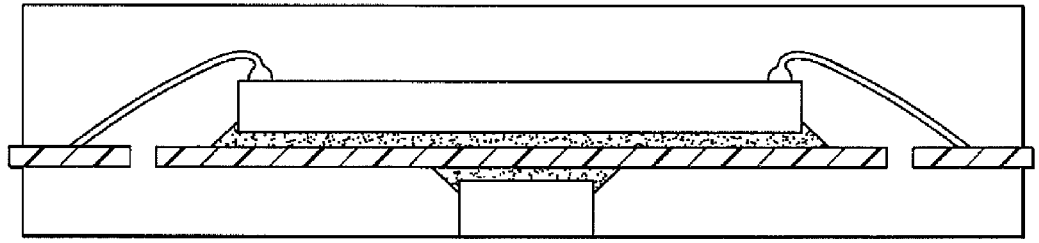
FIG. 2C is another embodiment of the die-up semiconductor package similar to the package shown in FIG. 2B.
Figure 2D:
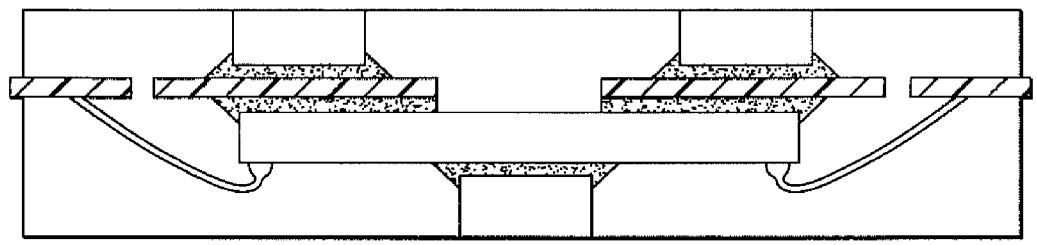
FIG. 2D is another embodiment of the die-down semiconductor package with split die-attach pad.

FIG. 2B is another embodiment of the die-down semiconductor package according to the present disclosure that comprises only one position member-and, in addition, has an offset die-attach pad in comparison with the lead terminals. FIG. 2C is another embodiment of the die-up semiconductor package similar to the one shown in FIG. 2B. FIG. 2D is another embodiment of the die-down semiconductor package that has a split die-attach pad so that each part of the die-attach pad has a position member.

The leadframe could be preformed, e.g., at the tie bar, such that the position member can always maintain a fixed height flush against the surface of the mold by the use of spring effect from the offset as shown in FIGS. 2B and 2C. The leadframe may be manufactured from any available leadframe material known to those skilled in the art. In one embodiment according to present disclosure, the leadframe is composed of Cu, pre-plated frame ("PPF"), or Alloy 42.

It should be understood that the die-attach pad may have any suitable design. In certain embodiments, the die-attach pad has a split configuration.

It should also be understood that the position members may be made of any suitable material. In certain embodiments, the position members are composed of, for example, Si, Cu, or Epoxy.

It should further be understood that the materials for the die attach may be any available die attach material known to those skilled in the art. In certain embodiments, the die attach material is paste, tape, or any other deformable adhesive.

It should also be understood that the wires for wire bonding may be any available wire bonding material known to those skilled in the art. In certain embodiments, the wires for wire bonding are composed of, for example, gold, copper, or aluminum.

It should further be understood that the molding compound may be any available molding material known to those skilled in the art. For example, the molding material may be a hard or soft deformable material.

FIGS. 3A-3E provide a detailed description of assembling the semiconductor package in accordance with one embodiment of the present disclosure. The assembly process initially provides a leadframe with a die-attach pad and a plurality of lead terminals. While the process is illustrated using a single die-attach pad, it should be understood that the process is also applicable to a split design die-attach pad.

Figure 3A:
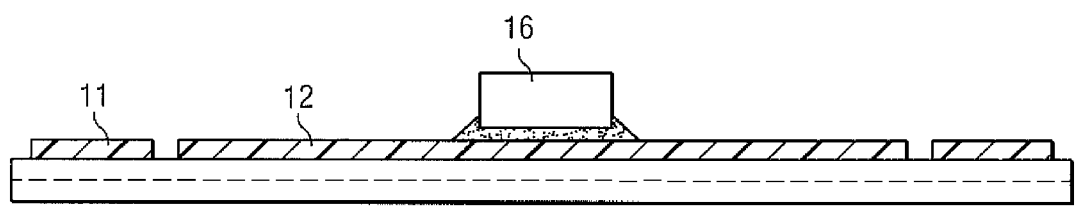
FIGS. 3A-3E is an illustrative process for manufacturing a very thin semiconductor package with two position members in accordance with one embodiment of the present disclosure.
Figure 3B:
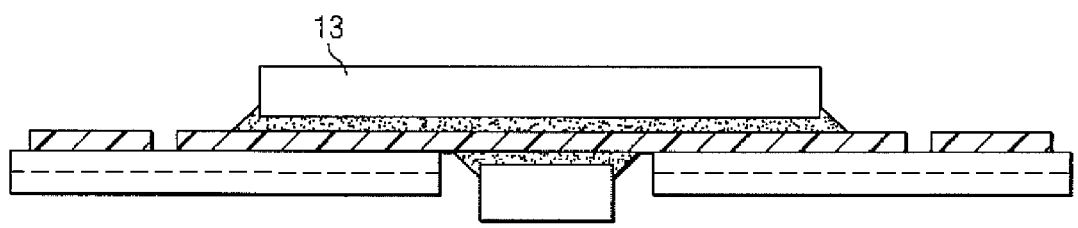
Figure 3C:
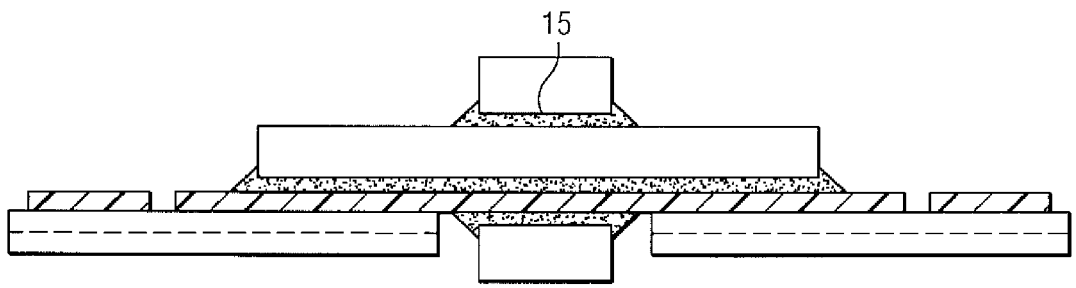

Referring to FIGS. 3A-3E, the assembling process starts with disposing a first position member 16 to one side of the die-attach pad 12 as shown in FIG. 3A. If the die-attach pad is a split design, each pad will be disposed with one position member. In one embodiment, the position member may be adhered to the leadframe by adhesives such as glue, paste, tape and deformable Material. In another embodiment, the position member may be an integrated part of the leadframe, so that this step may be omitted altogether. Then one die 13 is attached to the die-attach pad using any conventional die attach techniques as shown in FIG. 3B. Then, a second position member 15 is optionally disposed onto the top of the die as the first position member as shown in FIG. 3C.

Figure 3D:
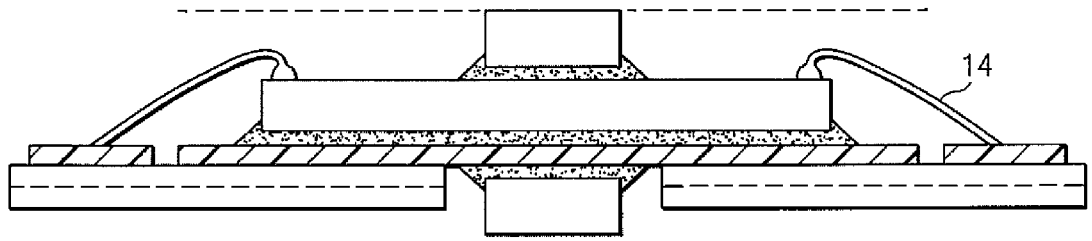
Figure 3E:
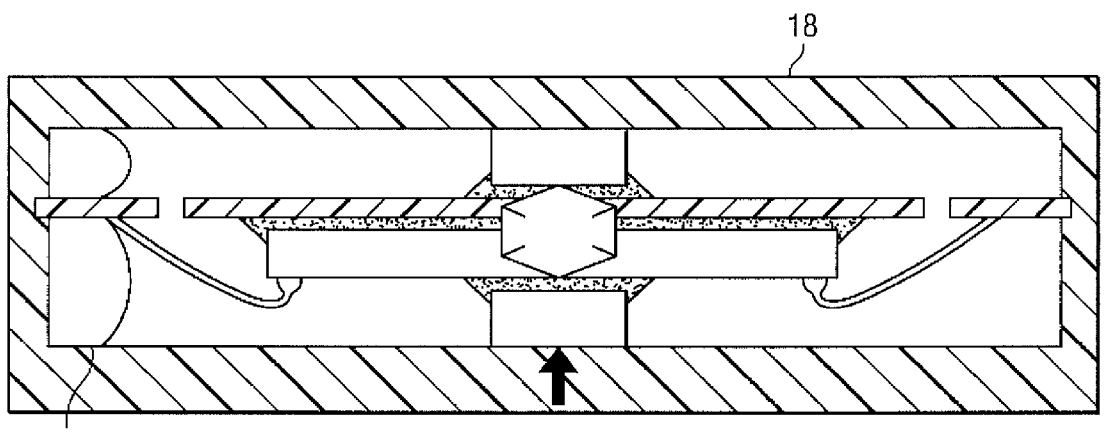

The die is then electrically connected to the lead terminals 11 of the leadframe by wire bonding 14 as shown in FIG. 3D. The wire bonding can be done using any of the available techniques known to those skilled in the art. Finally, the leadframe, die, bonding wires, and position member(s) are encapsulated by a molding compound 17 via injection molding as shown in FIG. 3E. The mold 18 can be any suitable molding device. It is to be appreciated that the typical sequence of assembly of the package is not restricted to the sequences as described above. For example, the attaching of the position member can be done before or after the die attach process is completed. In addition, the position members are exposed at the surface of the packages.

In certain embodiments, the position member may be made of thermal conductive materials. When the adhesive materials used for the position member attachment are thermal conductive, the exposure of the position members on the surface of the very thin semiconductor package will enhance the thermal performance of the package.

The following model examples illustrate some embodiments of the present disclosure. They are by no means intended to limit the practice of the principles of the present disclosure.

Figure 4:
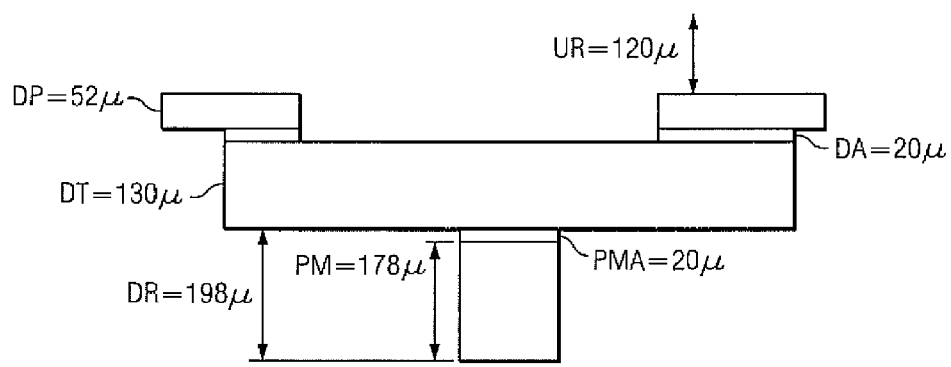
FIG. 4 is a very thin semiconductor package design for warpage test.

As shown in FIG. 4, there is provided a model semiconductor package that is manufactured in accordance with an embodiment of the present disclosure. In FIG. 4, PM is an abbreviation for position member thickness; PMA for position member attach thickness; DP for Die Pad Thickness; DT for Die Thickness; DA for Die Attach Thickness; UR for Resin thickness in upper cavity; and DR for Resin thickness in lower cavity. The model semiconductor packages were subjected to warpage tests. The split pad package as a control case comprises a copper leadframe with split pad design, while the full pad package comprises a full pad design. The simulation results are shown in Table 1. Negative warpage means that the edge of package warps down and its center warps up. Positive warpage means that the edge of package warps up and its center warps down.

TABLE 1

Effects of different position members on warpage

| | No position member | With position member 3 × 3 mm (silicon) | With position member 3 × 3 mm (copper) |
|---|---|---|---|
| Control case | 4.3 um | −33.2 um | 18.26 um |
| Full pad | −35.32 um | −64.25 um | −15.72 um |

The warpage tests were conducted with different sizes of position member. When the package design with a split pad was tested with different sizes of position members, the warpages increased with the increase of the sizes of position members. The results are shown in Table 2 below.

TABLE 2

Results of warpage tests

| No position member | Position member 1 × 1 mm | Position member 2 × 2 mm | Position member 3 × 3 mm | Position member 4 × 4 mm |
|---|---|---|---|---|
| 4.3 um | −6.42 mm | −17.52 mm | −33.2 mm | −51.81 mm |

The introduction of a position member into a semiconductor package in accordance with the principles of the present invention has been experimentally determined to significantly increase the yield of the molding process during packaging. When semiconductor packages are without any position members, the dies and bonding materials can be subjected to substantial offset flexing by high speed molding processes. The offset flexing has two effects on the final semiconductor packages: (1) the dies and bonding materials may lose their good contacts so that the packages will have dissatisfactory electronic characteristics, and (2) the offset dies and bonding materials can cause very substantial warpages when the offset flexing is substantial. Such very substantial warpages typically disqualify the affected packages from further applications. Notably, the two effects of offset flexing are not mutually exclusive, but rather can both be present in a single semiconductor package.

While a position member as disclosed herein can reduce or prevent the substantial offset flexing described, the position member can also introduce small but acceptable warpages into packages. The afore-mentioned examples illustrate increased warpage as a result of the addition of position member(s). In addition, position-member size can correlate with increased warpages.

Warpage is defined as the deviation of edges and center from an assumed plane. When the position member and the remaining package are composed of different materials, warpage may be increased. Moreover, it appears from the examples that the material composition of the position member can further affect warpage. Routine experimentation will determine appropriate selection of materials for a position-member.

One advantage of the present disclosure is that the very thin semiconductor package may be manufactured without redesigning new leadframes. Another advantage of the present disclosure is that die thickness and die attaching process are well controlled; the extra steps are multiple passes of die attaching. Yet another advantage of the present disclosure is that the manufacturing process for die stacking is well established and currently being done for System-In-Package.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for manufacturing a semiconductor package, the method comprising: providing a leadframe with a plurality of lead terminals and a die-attach pad; adhering a first position member to one side of the die-attach pad; disposing a die onto a surface of the die-attach pad opposite to the first position member, wherein the first position member is smaller than the die pad and configured to reduce vertical flexing of the die during a package assembly process; electrically connecting the die to the plurality of lead terminals; and encapsulating the leadframe, the die, the bonding wires, and at least a portion of the first position member with a molding compound to form the semiconductor package, wherein a surface of the first position member forms a portion of an exterior surface of the semiconductor package.

2. The method of claim 1 further comprising:
    disposing a second position member onto a surface of the die opposite to the die-attach pad.

3. The method of claim 1, wherein disposing the die and adhering the first position member includes using adhesives selected from the group consisting of: glue, paste, tape and deformable material.

4. The method of claim 1, wherein electrically connecting the die to the lead terminals is accomplished by wire bonding.

5. The method of claim 1, wherein the wire bonding is made of a material selected from the group consisting of: gold, copper, and aluminum.

6. The method of claim 1, wherein the die-attach pad has a split die-attach pad design.

7. The method of claim 6, wherein each part of the die-attach pad has a position member.

8. The method of claim 1, wherein the leadframe is made of a material selected from the group consisting of: Cu, PPF, and Alloy 42.

9. The method of claim 1, wherein the position member is made of a material selected from the group consisting of: Si, Cu, and Epoxy.

10. The method of claim 1, wherein the first position member comprises thermal conductive materials, and wherein, when a thermally conductive adhesive material is used for position member attachment, exposure of the first position member at the surface of the semiconductor package enhances thermal performance of the semiconductor package.

11. The method of claim 1, wherein the first position member is an integral part of the leadframe.

12. A method for manufacturing a semiconductor package, the method comprising: providing a leadframe with a plurality of lead terminals and a die-attach pad; disposing a die onto one side of the die-attach pad; disposing a first position member adjacent to a surface of the die-attach pad opposite the die; disposing a second position member adjacent a surface of the die opposite the die-attach pad, wherein the first and second position members are smaller than the die pad and configured to reduce vertical flexing of the die during a package assembly process: electrically connecting die to the plurality of lead terminals with a plurality of bonding wires; and encapsulating the leadframe, the die, the bonding wires, and at least a portion of each of the first and second position members with a molding compound to form the semiconductor package, wherein a surface of each of the first and second position members forms a portion of an exterior surface of the semiconductor package.

13. The method of claim 12 further comprising:
disposing the first and second position members in substantial alignment onto opposite sides of the die-attach pad and the die.

14. The method of claim 12, wherein disposing the die and the first and second position members includes using adhesives selected from the group consisting of: glue, paste, tape and deformable material.

15. The method of claim 12, wherein electrically connecting the die to the lead terminals is accomplished by wire bonding.

16. The method of claim 12, wherein the wire bonding is made of a material selected from the group consisting of: gold, copper, and aluminum.

17. The method of claim 12, wherein the die-attach pad has a split die-attach pad design.

18. The method of claim 17, wherein each part of the die-attach pad has a position member.

19. The method of claim 12, wherein the leadframe is made of a material selected from the group consisting of: Cu, PPF, and Alloy 42.

20. The method of claim 12, wherein the first and second position members are made of a material selected from the group consisting of: Si, Cu, and Epoxy.

21. The method of claim 12, wherein the first and second position members comprise thermally conductive materials, and wherein, when a thermally conductive adhesive material is used for position member attachment, exposure of the first and second position members at the surface of the semiconductor package enhances thermal performance of the semiconductor package.

22. The method of claim 12, wherein the first and second position members are an integral part of the leadframe.

* * * * *